(12) United States Patent
Shrinivasan et al.

(10) Patent No.: US 7,941,039 B1
(45) Date of Patent: May 10, 2011

(54) PEDESTAL HEAT TRANSFER AND TEMPERATURE CONTROL

(75) Inventors: Krishnan Shrinivasan, San Jose, CA (US); Stephen V. Gentile, San Jose, CA (US); Peter Woytowitz, Mountain View, CA (US); Sassan Roham, San Ramon, CA (US); George Kamian, Scotts Valley, CA (US); Michael Rivkin, Los Altos, CA (US)

(73) Assignee: Novellus Systems, Inc., San Jose, CA (US)

( * ) Notice: Subject to any disclaimer, the term of this patent is extended or adjusted under 35 U.S.C. 154(b) by 753 days.

(21) Appl. No.: 11/851,310

(22) Filed: Sep. 6, 2007

Related U.S. Application Data

(63) Continuation-in-part of application No. 11/184,101, filed on Jul. 18, 2005, now Pat. No. 7,327,948.

(51) Int. Cl.
*A21B 2/00* (2006.01)
*C23C 16/00* (2006.01)

(52) U.S. Cl. .................................. 392/416; 118/724

(58) Field of Classification Search ............... 392/416, 392/407–440; 219/405; 118/724, 725, 726
See application file for complete search history.

(56) References Cited

U.S. PATENT DOCUMENTS

| | | | |
|---|---|---|---|
| 3,612,825 A | 10/1971 | Chase et al. | |
| 4,457,359 A | 7/1984 | Holden | |
| 4,535,835 A | 8/1985 | Holden | |
| 4,563,589 A | 1/1986 | Scheffer | |
| 5,113,929 A | 5/1992 | Nakagawa et al. | |
| 5,178,682 A | 1/1993 | Tsukamoto et al. | |
| 5,228,208 A | 7/1993 | White et al. | |
| 5,282,121 A | 1/1994 | Bornhorst et al. | |
| 5,447,431 A | 9/1995 | Muka | |
| 5,558,717 A | 9/1996 | Zhao et al. | |
| 5,588,827 A | 12/1996 | Muka | |

(Continued)

FOREIGN PATENT DOCUMENTS

JP 01-107519 4/1989

(Continued)

OTHER PUBLICATIONS

Shrinivasan et al., "Single-Chamber Sequential Curing of Semiconductor Wafers," Novellus Systems, Inc., U.S. Appl. No. 11/115,576, filed Apr. 26, 2005.

(Continued)

*Primary Examiner* — Daniel Robinson
(74) *Attorney, Agent, or Firm* — Weaver Austin Villeneuve & Sampson LLP

(57) ABSTRACT

Provided herein are assemblies that, when coupled to an object, are capable of keeping the object at a uniform elevated temperature while removing large amounts of heat from an external source. Applications include various integrated circuit fabrication processes that use such external sources to expose wafers to radiation. In certain embodiments, the assemblies include a pedestal for supporting the wafer or other object. In certain embodiments, the assemblies include a calibrated heat resistance that allows heat be conducted away from the pedestal and wafer to maintain the desired set-point temperature. In certain embodiments, the pedestal may have one or more protrusions used to dissipate or transfer heat from the pedestal to a heat sink. Also, in certain embodiments, the pedestal surface is configured to have a spectral reflectivity of desired values in such way as to reflect the wavelengths that are emitted by an external radiant heat source.

15 Claims, 9 Drawing Sheets

U.S. PATENT DOCUMENTS

| | | | |
|---|---|---|---|
| 5,811,762 A * | 9/1998 | Tseng | 219/385 |
| 6,072,163 A | 6/2000 | Armstrong et al. | |
| 6,087,632 A | 7/2000 | Mizosaki et al. | |
| 6,200,634 B1 | 3/2001 | Johnsgard et al. | |
| 6,214,184 B1 * | 4/2001 | Chien et al. | 204/298.15 |
| 6,228,438 B1 | 5/2001 | Schmitt | |
| 6,307,184 B1 | 10/2001 | Womack et al. | |
| 6,394,797 B1 | 5/2002 | Sugaya et al. | |
| 6,413,321 B1 * | 7/2002 | Kim et al. | 118/725 |
| 6,467,491 B1 | 10/2002 | Sugiura et al. | |
| 6,559,424 B2 | 5/2003 | O'Carroll et al. | |
| 6,563,092 B1 | 5/2003 | Shrinivasan et al. | |
| 6,639,189 B2 | 10/2003 | Ramanan et al. | |
| 6,860,965 B1 | 3/2005 | Stevens | |
| 6,895,179 B2 * | 5/2005 | Kanno et al. | 392/416 |
| 6,899,765 B2 | 5/2005 | Krivts et al. | |
| 7,138,606 B2 * | 11/2006 | Kanno et al. | 219/390 |
| 7,253,125 B1 | 8/2007 | Bandyopadhyay et al. | |
| 7,265,061 B1 | 9/2007 | Cho et al. | |
| 7,327,948 B1 * | 2/2008 | Shrinivasan et al. | 392/416 |
| 7,410,355 B2 | 8/2008 | Granneman et al. | |
| 2002/0117109 A1 | 8/2002 | Hazelton et al. | |
| 2002/0162630 A1 | 11/2002 | Satoh et al. | |
| 2003/0013280 A1 | 1/2003 | Yamanaka | |
| 2003/0113187 A1 | 6/2003 | Lei et al. | |
| 2004/0023513 A1 | 2/2004 | Aoyama et al. | |
| 2004/0060917 A1 | 4/2004 | Liu et al. | |
| 2004/0183226 A1 | 9/2004 | Newell et al. | |
| 2004/0187790 A1 | 9/2004 | Bader et al. | |
| 2005/0045616 A1 | 3/2005 | Ishihara | |
| 2006/0018639 A1 * | 1/2006 | Ramamurthy et al. | 392/416 |
| 2006/0081186 A1 * | 4/2006 | Shinriki et al. | 118/724 |
| 2007/0107845 A1 | 5/2007 | Ishizawa et al. | |
| 2009/0060480 A1 | 3/2009 | Herchen | |

FOREIGN PATENT DOCUMENTS

| | | | |
|---|---|---|---|
| JP | 06/037054 | | 2/1994 |
| JP | 07/147274 | | 6/1995 |
| JP | 09-092615 | | 4/1997 |
| JP | 2005/116655 | | 4/2005 |
| KR | 2003/0096732 | | 12/2003 |
| WO | 02/11911 | | 2/2002 |
| WO | WO 02/11911 | * | 2/2002 |

OTHER PUBLICATIONS

U.S. Office Action mailed Oct. 3, 2007, from U.S. Appl. No. 11/115,576.

U.S. Final Office Action mailed May 2, 2008, from U.S. Appl. No. 11/115,576.

U.S. Office Action mailed Oct. 17, 2008, from U.S. Appl. No. 11/115,576.

Doble et al., "Concave Pedestal for Uniform Heating of Silicon Wafers," Novellus Systems, Inc., U.S. Appl. No. 11/546,189, filed Oct. 10, 2006.

Landess et al., "Tailored Profile Pedestal for Therm-Elastically Stable Cooling or Heating of Substrates," Novellus Systems, Inc., U.S. Appl. No. 11/129,266, filed May 12, 2005, pp. 1-25.

U.S. Office Action mailed Jun. 16, 2008, from U.S. Appl. No. 11/546,189.

U.S.Final Office Action mailed Oct. 16, 2008, from U.S. Appl. No. 11/546,189.

U.S. Office Action mailed Jul. 18, 2006, from U.S. Appl. No. 11/184,101.

Notice of Allowance and Fee Due mailed Jan. 25, 2007, from U.S. Appl. No. 11/184,101.

Allowed Claims from U.S. Appl. No. 11/184,101.

Rivkin et al., "Load Lock Design for Rapid Wafer Handling," Novellus Systems, Inc., U.S. Appl. No. 11/608,185, filed Dec. 7, 2006.

Nordin et al., "Closed Loop Temperature Heat Up and Control Utilizing Wafer-To-Heater Pedestal Gap Modulation," Novellus Systems, Inc., U.S. Appl. No. 11/937,364, filed Nov. 8, 2007.

Gage et al., "Transferring Heat in Loadlocks," Novellus Systems, Inc., U.S. Appl. No. 12/140,196, filed Jun. 16, 2008.

Rivkin et al., "Photoresist Stripping Method and Apparatus," Novellus Systems, Inc., U.S. Appl. No. 61/050,880, filed May 6, 2008.

Gage et al., "Minimum Contact Area Wafer Clamping with Gas Flow for Rapid Wafer Cooling," Novellus Systems, Inc., U.S. Appl. No. 12/333,239, filed Dec. 11, 2008.

U.S. Appl. No. 11/937,364, Office Action mailed Apr. 9, 2010.

U.S. Appl. No. 11/115,576, Office Action mailed Apr. 22, 2009.

U.S. Appl. No. 11/115,576, Office Action mailed Apr. 15, 2010.

U.S. Appl. No. 11/129,266, "Tailored profile pedestal for thermoelastically stable cooling for heating of substrates", Landess et al., filed May 12, 2005.

U.S. Appl. No. 11/129,266, Office Action mailed Feb. 20, 2009.

U.S. Appl. No. 11/129,266, Office Action mailed Oct. 28, 2009.

U.S. Appl. No. 12/749,170, "Tailored profile pedestal for thermoelastically stable cooling or heating of substrates", Landess et al., filed Mar. 29, 2010.

U.S. Appl. No. 11/608,185, Office Action mailed Apr. 26, 2010.

U.S. Appl. No. 11/751,584, "Cast pedestal with heating element on coaxial heat exchanger", Shrinivasan et al., filed May 21, 2007.

U.S. Appl. No. 12/341,943, "Atomic layer removal for high aspect ratio gapfill", van Schravendijk et al., filed Dec. 22, 2008.

U.S. Appl. No. 61/122,308, "Conductively cooled process for wide temperature range processes", Nich et al., filed Dec. 12, 2008.

U.S. Appl. No. 12/435,890, "Photoresist stripping method and apparatus", Rivkin et al., filed May 5, 2009.

U.S. Appl. No. 12/341,943, Office Action mailed Jun. 11, 2010.

International Search Report and Written Opinion for application No. PCT/US2009/067040, mailed Aug. 2, 2010.

\* cited by examiner

PEDESTAL HEAT TRANSFER AND TEMPERATURE CONTROL

CROSS-REFERENCE TO RELATED APPLICATION

This application is a continuation-in-part of and claims priority to U.S. application Ser. No. 11/184,101, filed Jul. 18, 2005, incorporated by reference herein in its entirety and for all purposes.

BACKGROUND

During semiconductor processing operations, a wafer may need to be exposed to radiation, plasma discharge, or other phenomena during processing steps such as cure, plasma deposition, photoresist strip, etc. While providing the necessary wafer treatment, the radiation or processing technique may cause large amounts of heat to be transferred to the wafer and the pedestal that supports the wafer. Removing heat flux from the pedestal is often necessary to maintain wafer and pedestal at their desired processing temperatures.

For example, in a UV-cure process, a wafer may be exposed to radiation generated by a mercury vapor lamp. In order to generate said vapor, the lamps must operate at significantly higher temperatures than is desired for processing many films. To accelerate curing as much as possible, it is desirable that the wafer be processed as close to the maximum temperature limit (e.g., around 400° C.) as possible. Typical commercial lamp systems cause the lamp envelope to reach temperatures between 800° and 900° C. The IR radiation emitted by the lamp envelope is incident on the wafer in much the same way as the UV emanating from the lamp discharge. This will cause the wafer temperature to increase above the preferred set-point if active cooling is not performed. Moreover, wafer temperature non-uniformity due to lamp heating (typically 30° C. range) is far worse than that due to pedestal heating (as low as 3° C. range).

SUMMARY OF THE INVENTION

Provided herein are assemblies that, when coupled to an object, are capable of keeping the object at a uniform elevated temperature while removing large amounts of heat from an external source, such as IR and UV sources. Applications include various integrated circuit fabrication processes that use such external sources to expose wafers to radiation. In certain embodiments, the assemblies include a pedestal for supporting the wafer or other object. In certain embodiments, the assemblies include a calibrated heat resistance that allows heat be conducted away from the pedestal and wafer to maintain the desired set-point temperature. In certain embodiments, a pedestal has one or more protrusions used to dissipate or transfer heat from the pedestal to a heat sink. Also, in certain embodiments, the pedestal surface is configured to have a spectral reflectivity of desired values in such way as to reflect the wavelengths that are emitted by an external radiant heat source. In certain embodiments, the assemblies include cooling elements such as cooling channels. In these embodiments, commonly available semiconductor fabrication facility water may be used as the only coolant.

DETAILED DESCRIPTION OF THE PREFERRED EMBODIMENTS

Introduction

In the following detailed description of the present invention, numerous specific embodiments are set forth in order to provide a thorough understanding of the invention. However, as will be apparent to those skilled in the art, the present invention may be practiced without these specific details or by using alternate elements or processes. In other instances well-known processes, procedures and components have not been described in detail so as not to unnecessarily obscure aspects of the present invention. While the use of radiation and in particular ultraviolet (UV) radiation has been employed for purposes of illustrating the present invention, other forms of radiation (i.e., from other parts of the electromagnetic spectrum) can also be practiced using the same essential elements described herein.

The pedestals and heat transfer assemblies are appropriate for applications where it necessary to remove a large amount of heat from an external source, such as lamps or a plasma discharge. In many embodiments, the pedestals are useful for processes in which it is necessary to maintain a wafer at a uniform temperature while removing heat from the external heat source. While the pedestal and heat transfer assemblies of the present invention are described in the context of curing and other IC fabrication processes such as photoresist strip processes, the invention is not so limited. Further, the heat transfer assemblies of the present invention are not limited to use in pedestals or IC fabrication processes, but may be used in any application where it is necessary to remove large amount of heat from an external source while maintaining an object at a uniform specified temperature. For example embodiments of the invention can be used to maintain temperature of chamber walls for semiconductor or other processes, particularly when they may need to be maintained at elevated temperatures while additional energy is incident on the same walls from higher temperature sources such lamps or a plasma discharge. Certain embodiments of the heat transfer assemblies described herein are also particularly useful in applications where heat flux from the external sources is not uniform and also when uniform temperature control is desired. Further, in certain embodiments, the heat transfer and pedestal assemblies may be used in applications in which it is necessary to remove large amounts of heat while workpiece temperature is not uniform (e.g., a wafer pre-heat station).

One application of the pedestal and heat transfer assemblies described herein is UV treatment of semiconductor wafers, including removing porogens, strengthening porous OSG backbones, improving dense non-porous OSG film properties, curing nitrides and other dielectric layers, densification of dielectric materials, and increasing stress in dielectric films (for, e.g., strained gates).

Figure 1A:
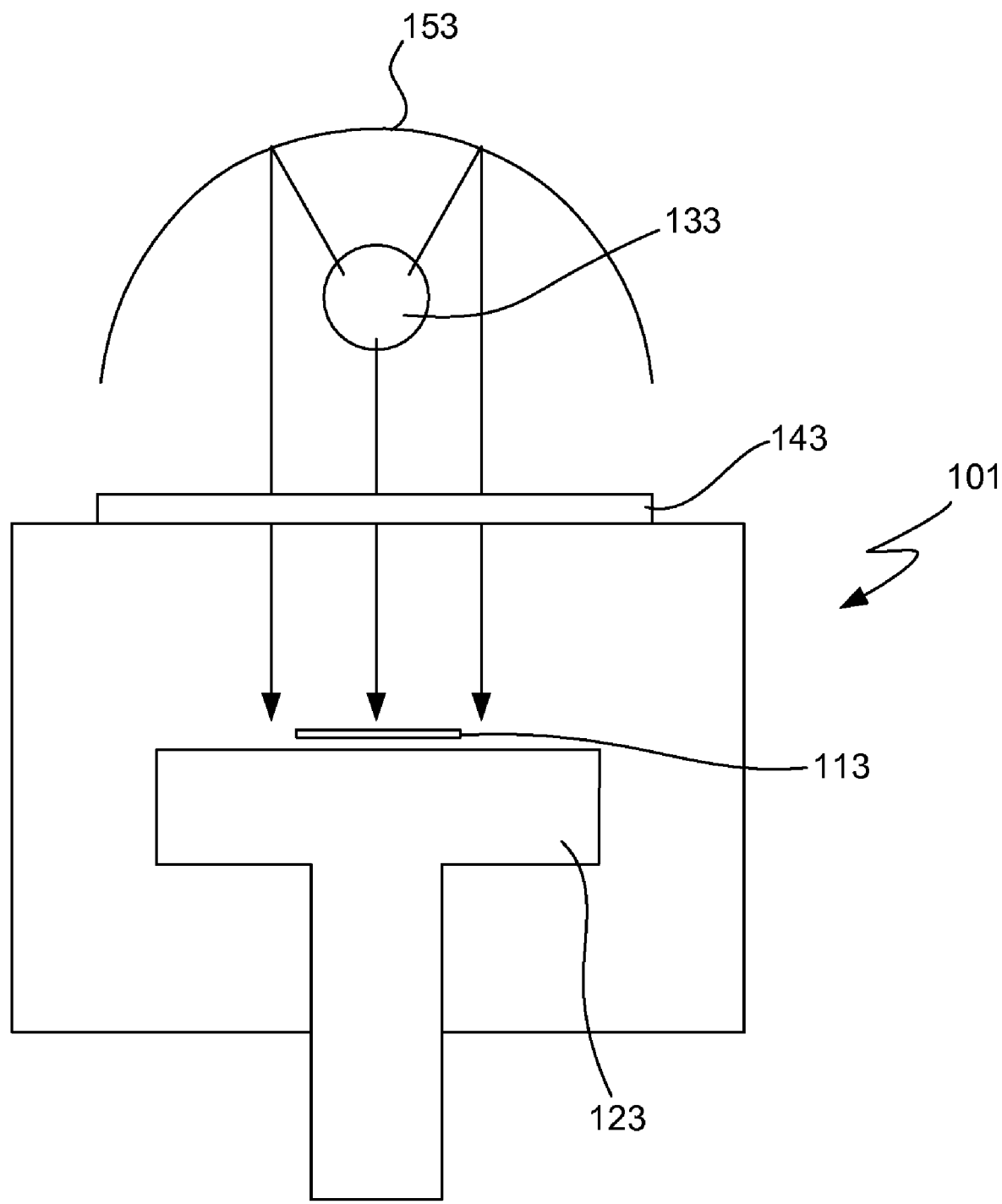
FIG. 1a is a schematic illustration showing a UV cure chamber.

FIG. 1a illustrates a chamber that may be used to cure semiconductor wafers. In FIG. 1a, wafer 113 is located on or above a wafer pedestal 123 in cure station 101. In some embodiments a chuck may be used to hold the wafer in place during the curing process. The wafer does not necessarily directly contact the chuck and/or pedestal. For example, the wafer may be floated above the wafer support on pins for example. UV radiation from UV light source 133 passes through window 143 to reach wafer 113. Some of the light is incident on the wafer after being reflected from reflector 153. Wafer 113 is then exposed to the radiation. Common types of UV lamps typically operate at temperatures of above 600° C., i.e., the quartz envelopes of the lamps are maintained at these temperature to maximize UV output. The resulting IR radiation from the lamps is also incident on the wafer. The cure station shown in FIG. 1a is an example of a single-station cure chamber. As discussed above, the geometry of commonly available UV radiation sources results in non-uniform irradiation of the wafer surface, thereby causing variations in the cure efficacy at various locations. Further, reflector systems (such as those discussed in U.S. application Ser. No. 11/115, 576, incorporated by reference herein in its entirety), are optimized for UV uniformity and not IR uniformity. Thus, even where uniform UV irradiation is achieved, the wafer may be exposed to non-uniform IR heat.

Curing processes such as those described above are very sensitive to wafer temperature. Therefore, it is important that wafer temperature be controlled uniformly and repeatably. Moreover, the wafer is itself assigned a very strict thermal budget, i.e., its temperature during process should not exceed a certain value. For e.g., when curing porous low-k dielectric films, the wafer temperature should not exceed 400° C. so as to not damage the underlying copper layers. As noted above, the presence of non-uniform IR radiation from the UV lamps creates two issues:

1. Since the lamps are at a higher temperature than is commonly desired for the wafer during curing, IR radiation incident on the wafer from these lamps will result in over-heating. Therefore, the excess IR flux from the lamps will need to be removed from the wafer so as to maintain it at a desired temperature.
2. Since, IR flux from the lamps is non-uniform, the wafer temperature will also be non-uniform. To compensate for this it is essential that the wafer be thermally coupled to a uniform source of heat. In semiconductor processing, heated metal pedestals offer the best method for providing uniform wafer temperature. To take advantage of this temperature uniformity, it is best to operate at high chamber pressures (>50 Torr) so that the higher gas thermal conductivity offered at these pressures provides for efficient thermal coupling between wafer and pedestal. As a consequence of this, the pedestal itself must be capable of operating at approximately the same temperature as that desired for the wafer during curing. Typically, for a 400° C. wafer temperature, the pedestal is set to operate at 380° C. to 390° C., the difference representing the temperature gradient induced by heat removed from the wafer to the pedestal.

In certain embodiments, the pedestals of the present invention successfully address these issues by being capable of operating at a high temperature, while retaining the ability to extract excess heat from the wafer. In one embodiment, the pedestal is capable of removing up to 4 kW of heat from a wafer, while operating at up to 450° C. for a typical cure process. To facilitate these specifications, the pedestal and assemblies according to certain embodiments are able 1) to elevate their temperatures to 450° C. and 2) to remove excess heat incident on the wafer and pedestal without causing a dip in temperature.

Commonly available coolants such as water and ethylene glycol (the main ingredient in automotive anti-freeze) boil at very low temperatures. Therefore, if they come in contact with the hot walls of a coolant channel in a pedestal maintained at an elevated temperature (e.g., 450° C.) these coolants will boil. Since boiling heat transfer is a very efficient means of removing heat, the result will be that the pedestal temperature will dip below the desired set-point of 450° C. Indeed, it is impossible to operate a pedestal at more than 200° C. with a low-boiling coolant such as water or ethylene glycol.

To remove heat from high temperature pedestals, high-boiling fluids have also been used as coolants. These coolants are not commonly available in semiconductor or other manufacturing facilities and thus a dedicated coolant delivery system must be provided. To prevent progressively increasing coolant temperatures, the excess heat removed from the pedestal must be extracted from the coolant, thus requiring external heat exchangers to cool the fluid down before re-introducing it to the pedestal. These systems are undesirable because of this complexity and also because it is difficult to pump high temperature fluids. Gas flown over the pedestal has also been used as a heat transfer fluid; however, this method is inefficient. These type of high-boiling fluids and their associated equipment reduce the reliability and safety and increase the cost of the system.

Figure 1B:
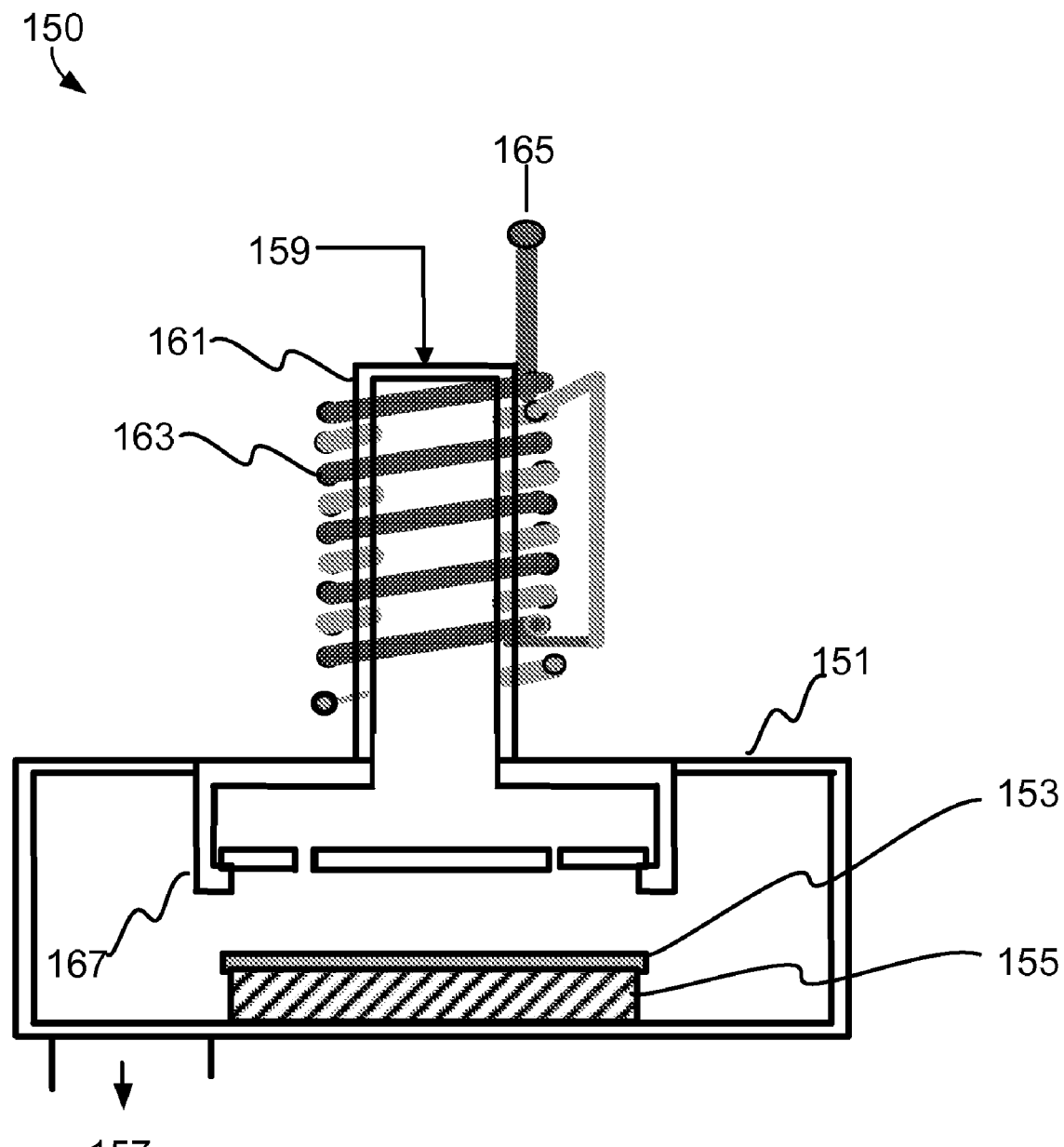
FIG. 1b is a schematic illustration showing a photoresist strip chamber.

Another application of the pedestal and heat transfer assemblies described herein is photoresist strip applications. FIG. 1b is a schematic illustration showing aspects of a downstream plasma apparatus 150 suitable for practicing the present invention on wafers. Apparatus 150 has a plasma producing portion 161 and an exposure chamber 151 separated by a showerhead assembly 167. Inside exposure chamber 151 a wafer 153 rests on a pedestal 165. In some embodiments, pedestal 165 is also configured for applying a bias to wafer 153. Low pressure is attained in exposure chamber 151 via vacuum pump via conduit 1677. A flow of the process gas is provided via inlet 159 into plasma producing portion 161 of the apparatus. Plasma producing portion 161 is surrounded in part by induction coils 163, which are in turn connected to a power source 165. During operation, gas mixtures are introduced into plasma producing portion 161, induction coils 163 are energized and a plasma is generated in plasma producing portion 161. Showerhead assembly 167, which has an applied voltage, terminates the flow of some ions and allows the flow of neutral species into exposure chamber 151. In the example depicted in FIG. 1b, an IR source is used to pre-heat the wafer. This IR heating (for example a lamp) occurs on a station prior to the one depicted in FIG. 1b but whose energy spills over onto the pedestal shown.

The IR source transfers heat by radiation to the wafer and pedestal. Additionally, ion bombardment also heats the wafer and pedestal to temperatures that may be undesirably high. As described above in the context of UV cure, the IR heat flux is not uniform, nor is heat flux generated by ion bombardment, and so the wafer and pedestal temperature needs to be coupled to a uniform heat source as well as have the excess heat flux from the IR source and/or ion bombardment removed. Controlling the wafer temperature may be difficult due to the combination of IR radiation heating, ion-bombardment heating and independent pedestal heating (by for example externally controlled embedded heaters). In many cases turning off the external heater power alone is insufficient to prevent the wafer's temperature from rising above the desired limit.

Any IC manufacturing process that heats a wafer, e.g., by radiation and/or ion-bombardment, or other similar manners, can have both the wafer and pedestal temperature controlled by the methods described herein. Such other IC manufacturing processes include, but are not limited to, PVD (physical vapor deposition, HDP (high-density plasma deposition) and PECVD (plasma enhanced chemical vapor deposition).

Independent Control of Workpiece Temperature and External Source Heat

According to various embodiments, the present invention provides independent control of the workpiece temperature regardless of the heat flux from an external lamp source or other external source. For example, by using the wafer pedestal of this invention in UV curing applications, the wafer temperature is decoupled from the UV intensity emanating from the lamps. Typically, curing chambers use broadband high-intensity sources, such as mercury-vapor lamps. Commercially available medium pressure mercury vapor lamps emit radiation of wavelength from below 200 nm to the far-IR range. The wafer is exposed to visible, UV and IR radiation. In typical dielectric curing applications, the visible and IR radiation causes wafer heating. In such lamp systems, intensity of radiation output is adjusted through modulation of electrical power that is fed to the lamps. This may occur either directly through adjustment of electrical voltage in arc-discharge lamps or by modulation of microwave power in those systems that use microwave plasma discharge. In either case, an increase in desirable UV output is accompanied by a corresponding increase in undesirable IR and visible energy output. Thus, the wafer temperature can become closely coupled to the UV intensity in conventional chambers. In addition, because the lamps typically do not illuminate the surface of the wafer uniformly, wafer temperature can be highly non-uniform across the surface of the wafer.

It is desirable to control the wafer temperature and provide high UV intensity without requiring sophisticated filtering systems to remove the IR radiation. Decoupling wafer temperature and UV intensity has benefits in addition to eliminating the harmful effects of non-uniform heat incident on the wafer. The ability to control wafer temperature independently of the UV intensity (and vice versa) allows for modulating certain side-effects of the curing process in preference to one another. The curing process has several side effects that may be beneficial to the various dielectric materials employed in an integrated circuit. As mentioned above, side effects of curing include increased stress and strain of the materials, increased cross-linking of the bonds of the material and densification the material. It is often desirable to increase one of these effects relative to the others for a particular application. For example, for dense low-k carbon-doped oxide films, it is desirable to increase the mechanical properties of the films by cross-linking without a large increase in the stress of the film. For silicon nitride films, a large increase in the stress is desirable. Any of these effects can be modulated in preference to the others by decoupling control of the wafer temperature from UV intensity. In other words, each combination of effect and side-effect requires its own optimal combination of temperature and UV flux.

In other IC manufacturing processes, there is an optimal radiation or plasma intensity to have the desired effect on the substrate. At the same time, there is a small temperature range at which the chemical and/or physical reactions on the wafer surface should occur. Temperatures that deviate from that temperature range may result in such issues as low-deposition rate, which slows down throughput or overheating of the substrate, which can cause damage in previously processed layers.

The present invention provides heat transfer assemblies and pedestals that are capable of modulating these effects by providing independent control of the wafer temperature and the UV, IR or other external source intensity. In certain embodiments, the pedestals and assemblies use a heat transfer resistance calibrated as required by the heat flux from the external heat source and the desired operating temperature. For example, a design may require that the heat transfer assembly be capable of removing from 3 kW to 4 kW from the wafer while maintaining the pedestal at a range of operating temperatures, e.g. 300° C. to 400° C. In certain embodiments, the resistance may be limited by two requirements: 1) the workpiece or pedestal temperature must not exceed the set-point temperature, and 2) if used, the water or other low boiling coolant temperature must stay below boiling.

In certain embodiments, the pedestals of this invention are equipped with a combination of heating elements and cooling elements to control their temperature. In certain embodiments, the wafer temperature is decoupled from the external heat source (by providing a heat sink or cooling elements to remove the IR heat) and coupled to a uniform and easily controlled source, i.e. the heating elements. In certain embodiments, pedestals are equipped with protrusions, stand-offs or other structures located between the main pedestal body and a cold surface or other heat sink and that cause heat transfer to the cold surface. The cold surface may or may not be include cooling channels or other cooling elements. Wafer temperatures may be maintained at levels as high as that which can be tolerated by materials used in the construction of integrated circuits, or assigned to the wafer as part of an overall thermal budget.

In certain embodiments, the heat transfer assemblies and pedestals of the present invention are capable of maintaining the wafer (or other workpiece) at an elevated uniform temperature, i.e. within 2° C. of a set-point temperature. The heat transfer assemblies of the present invention also provide consistent temperatures from pedestal to pedestal.

Figure 2A:
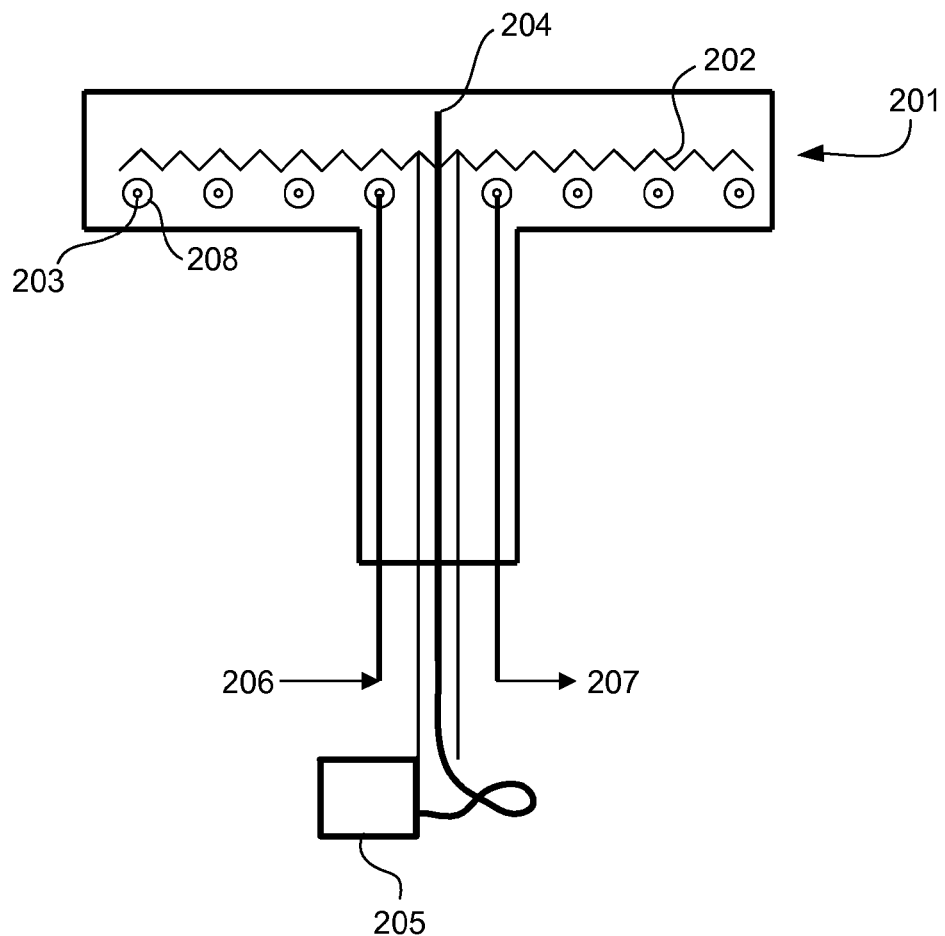
FIG. 2a is a schematic illustration showing a cross-section of a pedestal and heat transfer assembly according to one embodiment of the present invention.

FIG. 2a shows a cross-section of a pedestal containing a heat transfer assembly according to one embodiment of the invention. Pedestal 201 contains heater coils 202 and cooling channel 203. The heating elements or coils of this invention are controlled using a feedback loop. In the embodiment shown in FIG. 2a, thermocouple 204 is embedded in pedestal 201. Preferably the thermocouple is located close to the top surface on which a wafer rests for processing. Temperature readings from thermocouple 204 are fed to a closed-loop temperature controller 205, which adjusts electrical power fed to the heater so that the set-point temperature is maintained. The temperature controller automatically reduces power to the heater coils when heat from the external source is incident on the wafer so that the uniform temperature is maintained. Standard closed loop temperature control systems well known in the art may be used.

Figure 2B:
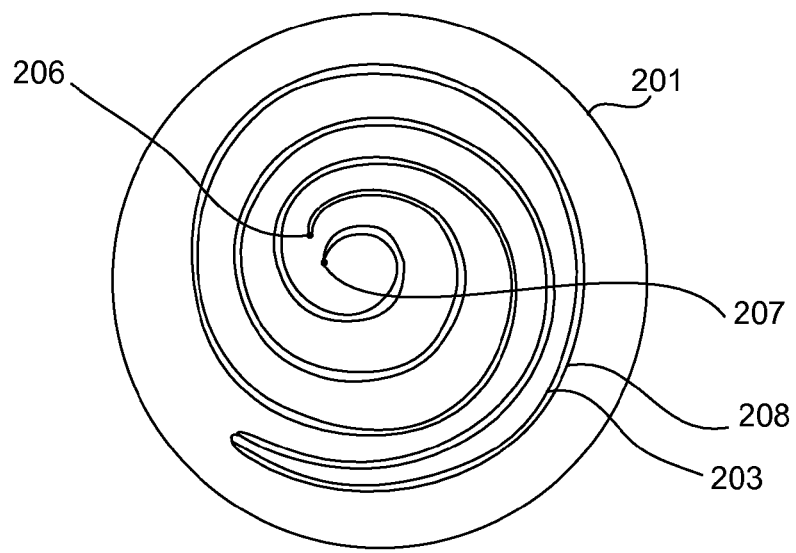
FIG. 2b is a schematic illustration showing a top view of cooling channels in a pedestal according to one embodiment of the present invention.

Cooling channel 203 is a tube arranged in a continuous spiral as shown in top view of the pedestal 201 as shown in FIG. 2b. Cooling water enters cooling channel 203 at inlet 206 and exits at outlet 207 after traveling the length of the channel. The cooling channel tube is surrounded by a layer 208. Layer 208 has a heat resistance calibrated so that heat from the external heat source may be removed by the water in cooling channel 203 while preventing the water from boiling. If the resistance of layer 208 is too high, not enough heat will be removed and the wafer temperature will rise above the set-point. This can damage or destroy the films already present on the wafer or lead to undesirable film characteristics. If the resistance of layer 208 is too low, too much heat will be removed. This will lead to water in cooling channel 203 to reach boiling temperature. Boiling will cause overcooling due to the latent heat of the evaporation. In addition, boiling is undesirable as it requires steam to be vented and prevents water from being returned to the facility. Overcooling of the wafer can also occur without boiling of the fluid. Overcooling of the wafer is undesirable from the process description previously described (see preferred and most preferred temperatures).

Figure 2C:
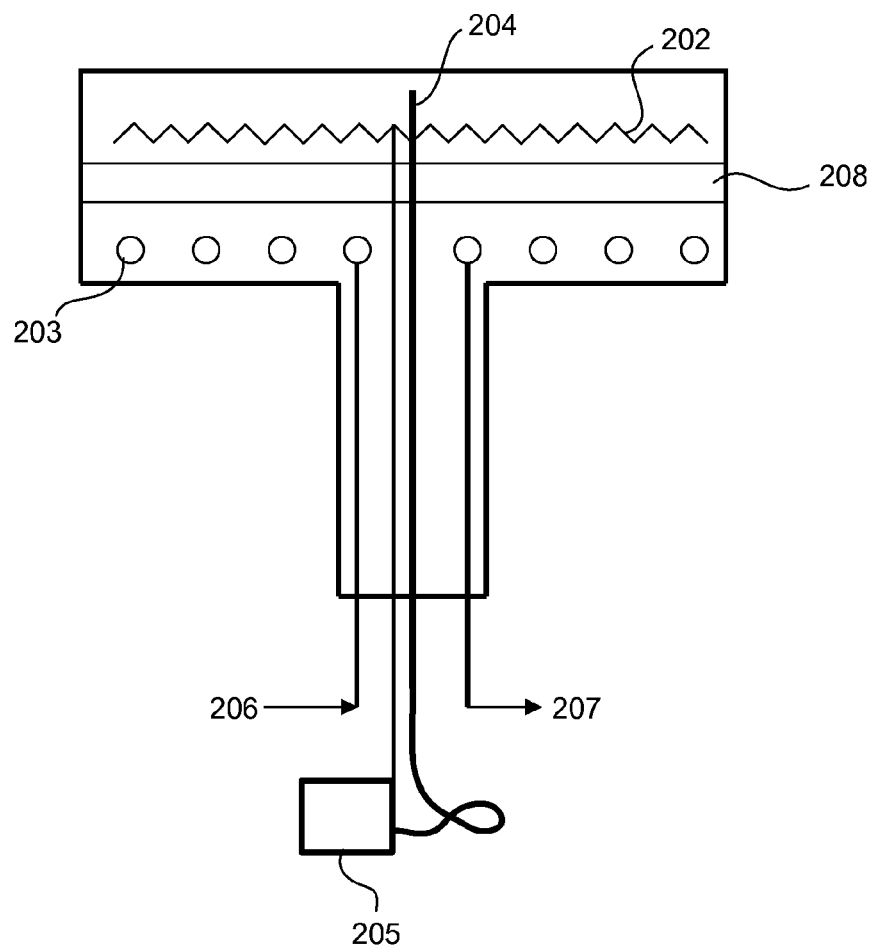
FIG. 2c is a schematic illustration showing a cross-section of a pedestal and heat transfer assembly according to one embodiment of the present invention.

In certain embodiments, the heat resistant layer is located between the heating elements and the cooling channel. Thus, the heat resistant layer in FIG. 2a comprises material enclosed by an outer tube that surrounds and is coaxial with the cooling channel. FIG. 2c shows an alternate embodiment. As with the embodiment shown in FIG. 2a, temperature controller 205 is connected to heating coils 202 and water flows through cooling channel 203. However in this embodiment cooling channel 203 is located below heat resistant layer 208. Heater coils 202 are located above layer 208.

In certain embodiments, the heating and cooling elements are cast into the pedestal. Casting a liquid metal around the heating and cooling elements (and the heat resistant layer for the tube-in-tube exchanger shown in FIG. 2a) is controllable to a high degree. Thus, it is possible to get a consistent interface between the heating elements and the coaxial tubes or other cooling elements and the pedestal metal. In preferred embodiments, only one casting is required to embed the heating elements, cooling elements and heat resistant layer in the pedestal.

Figure 4A:
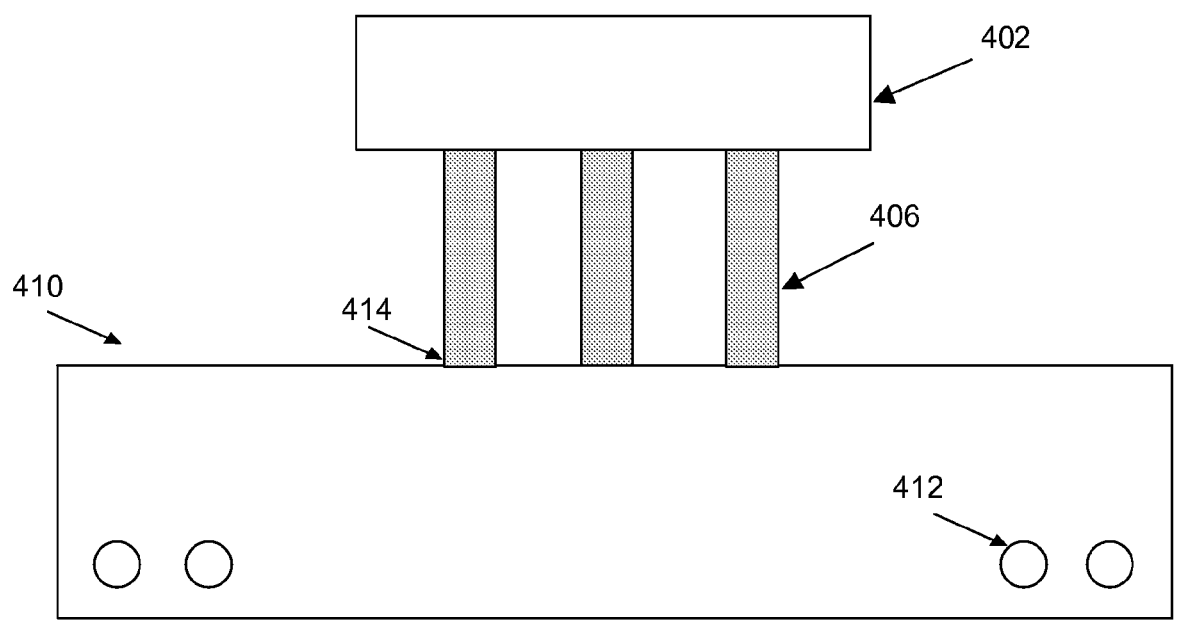
FIGS. 4a and 4b are schematic illustrations showing a cross-section of a pedestal with pedestal supports having a calibrated heat resistance according to certain embodiments of the present invention.

FIG. 4a shows another embodiment, in which the cooling elements are located outside the pedestal, in this case, in within one or more chamber walls housing the pedestal. Pedestal 402 is supported by pedestal supports 406, which are made of or include a heat resistant material having the desired heat resistance, such as metal, ceramic, plastic, etc. Cooling channels 412 are located in chamber bottom 410. Here, the pedestal is separated from the cooled chamber bottom by the calibrated heat resistance such the desired amount of energy is dissipated from the pedestal to the chamber bottom via the heat resistance.

Heating Elements

Heating elements are used to control the workpiece or object temperature. For example, in a UV cure chamber or other chamber, the wafer temperature is controlled by the heating elements. Standard resistive electrical heaters used to heat pedestals in CVD chambers that are well-known to one skilled in the art may be used. In certain embodiments, electrical heating coils in a metal sheath with a high melting point are used. The pedestal may be made by casting aluminum over the heating elements (as well as the cooling channels and resistant layer in certain embodiments), so the heating coil should be made of metal that has a higher melting point than aluminum. Examples of such metals include stainless steel, nickel, and high-nickel alloys such as Inconel and Hastelloy As discussed above, in many embodiments, the workpiece temperature is to be controlled depending on the application. According to various embodiments the controlled temperature may be from 200° C. to 600° C. In preferred embodiments wherein the workpiece is a wafer in IC fabrication process, the controlled temperature may be from 200° C. to 600° C., e.g., from 250° C. to 450° C. In a particular embodiment, the controlled temperature of a wafer is around 400° C. In certain embodiments, the controlled temperature may be lower, e.g., around 90° C.

For IC fabrication processes, the wafer should be closely coupled to the pedestal so that the pedestal controls the wafer temperature. Thermal coupling of the wafer and pedestal is described in U.S. application Ser. No. 11/115,576, referred to above. Briefly, the type of gas used and its pressure are important for providing efficient coupling between wafer and pedestal. A gas with high thermal conductivity (e.g., helium) is preferred to provide for efficient thermal coupling between the wafer and the pedestal or other support to the wafer. Helium gas at the desired pressure may be provided either by filling the process chamber, or by providing for wafer back-side pressure control using helium. In the latter case, the chamber pressure must be controlled at a higher value that that at the wafer back-side, albeit with a more commonly available gas such as nitrogen. By providing helium to just the wafer back-side its usage is curtailed. Heat transfer between the wafer and the pedestal takes place by conduction through the gas in the small physical gap between the two. The support can thus be used to control the temperature of the wafer. Depending on the application, operating at high pressure may be preferred so that higher gas conductivity can provide good thermal coupling between the wafer and the pedestal. A typical range is 10-600 Torr, e.g., 200-600 Torr. Throughout the description, pedestal temperature may be referred to instead of wafer temperature as the two are closely coupled. For example, at a typical operating temperature of 400° C., the pedestal is typically 15° C. cooler than the wafer over a wide range of UV lamp power settings and output intensities In some applications more significant differences between wafer and pedestal temperature may exist. However, for all applications of the apparatuses and methods described herein, the pedestal has the ability and may be used to influence the wafer temperature to some degree. In certain embodiments, the pedestal temperature is controlled only by adjusting the heating element power—the heating elements are actively controlled and the cooling elements are passively controlled so that coolant flow rate, etc. does not depend on the pedestal temperature. This is desirable since for a large range of coolant flow rates, the overall heat transfer coefficient is insensitive to the flow rate, thus, flow rate cannot be used to control heat transfer in this regime. On the other hand, the heat added is very sensitive to the current supplied to the heater, thus, one can accurately control the heat added through the heater elements. As indicated above, in certain embodiments, a heat sink with or without cooling channels is employed to absorb or dissipate the excess lamp heat. In these embodiments, the pedestal temperature may also be controlled only by adjusting the heating element power.

Although in certain applications, it is easier to control pedestal temperature with heating element power, as explained above, in other applications it may be useful to use the cooling elements to control the pedestal temperature. In such embodiments, it may be possible to eliminate or reduce the need for a heating element if the amount of heat generated by the external source is sufficient to heat the wafer to its desired temperature.

Cooling Elements

The cooling element is a typically a cooling channel or channels as shown in FIGS. 2a-c. In certain embodiments, the pedestal is constructed by pouring molten aluminum around the cooling coil. Thus, the cooling channel should be made of a metal that has a higher melting point than aluminum. Metals such as stainless steel, nickel, and high-nickel alloys such as Inconel and Hastelloy may be used. As shown in FIG. 2b, the cooling channels are typically arranged in a continuous spiral for embodiments wherein the heat transfer assembly is used in a pedestal. However, one of skill in the art would understand how to modify this design for different applications. Alternate embodiments include a zig-zag design such as that shown in cooling channels 203 in FIG. 2d.

In certain embodiments, cooling elements are located outside the pedestal, e.g., in within one or more chamber walls housing the pedestal. For example, FIG. 4a shows a pedestal 402 supported by pedestal supports 406, which are made of or include a heat resistant material having the desired heat resistance, such as metal, ceramic, plastic, etc. Cooling channels 412 are located in chamber bottom 410. Here, the pedestal is separated from a cooled surface by the calibrated heat resistance such the desired amount of energy is dissipated from the pedestal to the chamber bottom via the heat resistance. The cooling elements may also located outside the chamber housing—for example the may surround the chamber housing. In other embodiments, the cooled surface is separate from the pedestal and chamber body.

Figure 4B:
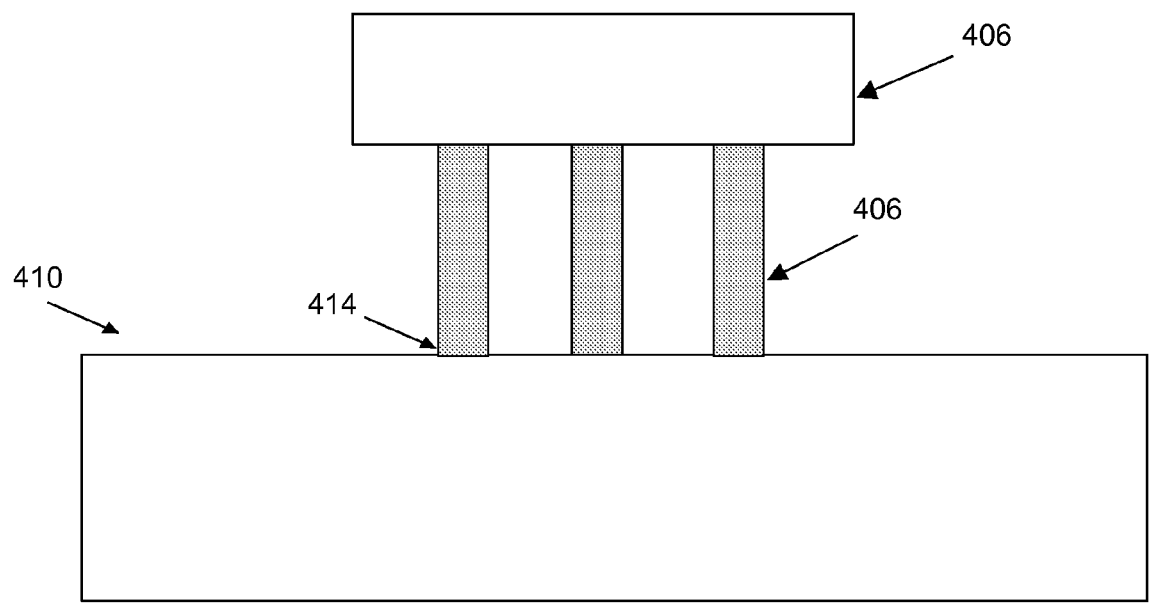

Also, in certain embodiments, heat is removed via a heat sink that does not have cooling channels other cooling elements. FIG. 4b shows such an arrangement according to certain embodiments. As in FIG. 4a, pedestal 402 is supported by pedestal supports 406, which are connected to the chamber bottom 410. In this embodiment, the material and size of the heat sink—in this case the chamber bottom and/or other chamber walls—is such that coolant is not required to remove heat. For example, a chamber bottom made of aluminum having a large mass compared to the pedestal, e.g., 10 times the pedestal mass, can absorb about 100-500 W without requiring separate cooling channels or separate cooling elements. FIGS. 4a and 4b also show contact area 414 between the pedestal supports and the heat sink. This contact area can be adjusted, for example, by machining grooves (to reduce contact area), or, by otherwise reducing or increasing the cross-sectional area in order to adjust the contact and conduction resistance. These modifications can increase or decrease the thermal resistance thus providing for adjustment of the amount of heat that is transferred across the elements.

As discussed above, the cooling channels or heat sink remove excess heat from the external source. (A small amount of heat from the external source may be removed by other mechanisms, for example in a UV cure chamber, by convective loss to the chamber walls.) The channels or heat sink are capable of removing any excess heat incident on the wafer from external sources so that its temperature does not exceed the set-point temperature.

According to various embodiments, the cooling elements of the present invention are capable of removing up to 10 kW of heat. For UV cure chamber applications, the cooling elements may be required to remove a range of heat flux. For example, if there is a plasma discharge in the chamber, the heat incident on the wafer may be as low as 100 W to 500 W. At the other end of the range, as with the case of UV lamps, as much as 10 kW of heat may be incident on the workpiece. The cooling elements are capable of removing a range of heat flux while the wafer temperature is maintained. In some embodiments, the heat flux may range from 100 W to 10 kW. In preferred embodiments, the heat flux ranges from 2 kW to 8 kW, and more preferably from 2 kW to 5 kW. In even more preferred embodiments, the heat flux ranges from 3 kW to 4 kW.

In certain embodiments, the heat transfer assemblies of the present invention are designed to use with low boiling coolants. Any low-boiling cooling fluid may be used, however water is particularly preferred. Other low-boiling coolants may include glycols, and engineered heat transfer fluids such as Galden and Fluorinert. In a particularly preferred embodiment, facility water is used as the coolant and is returned to the facility after use. Most semiconductor fabrication facilities have equipment cooling water loops to provide a readily available source of coolant. Depending upon the facility, the inlet water temperature may range from 10° C. to 25° C. In preferred embodiments, the inlet temperature is about 20° C. As discussed above, the outlet temperature should be below the boiling temperature. In preferred embodiments, the maximum outlet temperature is less than or equal to about 90° C. In more preferred embodiments, the maximum outlet temperature should be from about 50° C. to 80° C. In a particularly preferred embodiment, the exit temperature is about 60° C.

The flow rate of the water or other low boiling coolant will depend upon the particular application. For applications involving a semiconductor wafer on a pedestal, the flow rate should be at least 0.2 gallons per minute. Above this flow rate, the rate of cooling has been found to be independent of the flow rate. Flow rates ranging from 0.2 gallons per minute to 2 gallons per minute are preferred. Of course, one of skill in the art will understand that the optimal flow rate depends upon the design and construction particular process conditions as well as the application.

Calibrated Heat Resistance

The heat resistant layer has a heat transfer resistance calibrated as required by the heat flux from the lamps or other heat source and the desired operating temperature. For example, a design may require that the heat transfer assembly be capable of removing from 3 kW to 4 kW from the wafer while maintaining the pedestal at a range of operating temperatures, e.g. 300° C. to 400° C. As discussed above, in certain embodiments, the resistance may be limited by two requirements: 1) the workpiece or pedestal temperature must not exceed the set-point temperature, and 2) if used, the water or other low boiling coolant temperature must stay below boiling.

In certain embodiments, the resistance may be calibrated to remove the desired amount of heat while maintaining the pedestal at a range of operating temperatures. For example, the heat resistance may be calibrated to remove a set amount of heat from the pedestal, e.g., 3 kW. The heat sink may or may not employ a coolant. If a low-boiling coolant is used, the heat resistance may be calibrated to keep low-boiling coolant temperature below boiling as described above.

In certain embodiments, the heat resistant layer surrounds the cooling channels. For example, in one embodiment, the heat resistant layer surrounds the cooling channel tube and is enclosed by an outer tube, as shown in FIG. 2a. The outer tube is coaxial with the cooling channel. Typically it is also coextensive with the spiraled portion of the cooling channel. The heat resistant layer is located in the annular gap between the cooling channel and the outer tube. In another embodiment, shown in FIG. 2c, the heat resistant layer is above the cooling channel and below the heating elements.

According to various embodiments, the heat resistant layer may comprise a spiral coil, a heat resistant material such as sand, a compressed gas or any combination of these. In one embodiment, the heat resistant layer surrounds the cooling channel and is enclosed by an outer tube as described above. The resistance across the annular space between the tubes should dominate the heat transfer from the pedestal material to the coolant. In this embodiment, the layer preferably comprises a spiral coil of a defined pitch. In certain embodiments, the tubes and the wire coil are made from materials having a higher melting point than that of aluminum so that the pedestal may be constructed by pouring molten aluminum over the already-fabricated tube-in-tube heat exchanger. Appropriate materials include stainless steel, nickel and titanium.

Figure 3:
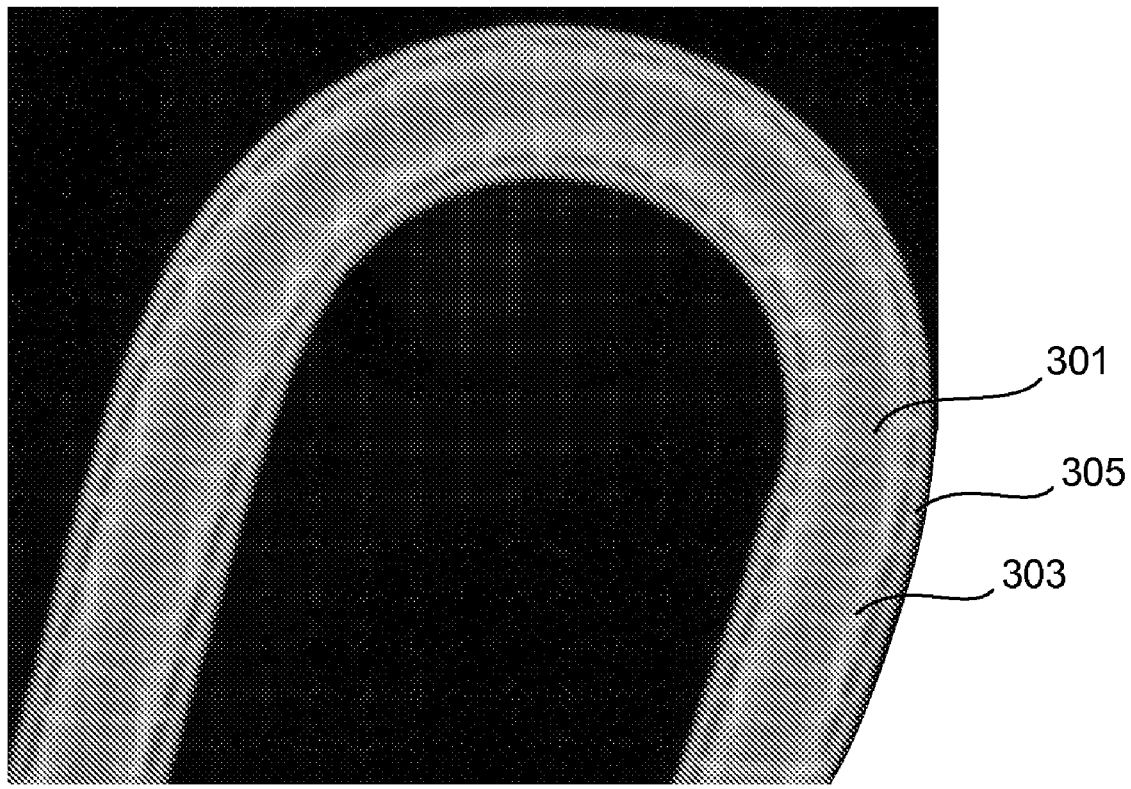
FIG. 3 is an X-ray image of tube-in-tube heat exchanger according to one embodiment of the present invention.

The tube-in-tube heat exchanger described above may be of any appropriate dimensions. For wafer pedestal applications, the following dimensions are preferred: for the inner tube (i.e., the cooling channel), an inner diameter (ID) ranging from 0.06 inches to 1 inch and an outer diameter (OD) ranging from 0.1 inches to 1.5 inches; for the outer tube, an ID ranging from 0.125 inches to 1.75 inches and an OD ranging from 0.188 inches to 2 inches. However, one of skill in the art will understand that the dimensions may be adjusted for the particular application. In a preferred embodiment, the diameter of the wire is equal to the annular gap distance, i.e. the ID of the outer tube minus the OD of the inner tube. One function of the wire coil (in addition to providing heat resistance) is to maintain the gap between the tubes. The wire coil maintains the gap even as the heat exchanger coils are bent to create the heat transfer assembly. FIG. 3 shows an x-ray of a coaxial tube-in-tube assembly with spiral wrapped wire according to one embodiment of the invention. Wire 301 is located between inner tube 303 and outer tube 305. As can be seen in FIG. 3, the uniform gap between tubes is maintained after being bent. In constructing the tube-in-tube assembly, it may be desirable to swage the outer tube over the inner tube. This will reduce the OD of the outer tube by a small amount on the order of a few milli-inches. Swaging the outer tube over the inner tube helps ensure performance repeatability from pedestal to pedestal.

The heat resistance of the layer may be calibrated by precisely setting the pitch and the annular gap distance (the ID of the outer tube minus OD of the inner tube). The pitch is the distance between loops of the spiral. Larger pitches result in less resistance. The desired amount of heat resistance may be achieved by properly setting the pitch. If the outer tube is swaged over the inner tube, the higher contact resistance caused by better contact between the tube surfaces and the spacing wire should be taken into account when calculating the required pitch and/or annular distance for a desired resistance.

Heat resistance may also be provided by material of a known resistance such as sand, ceramic beads or fiberglass. These materials may be used instead of or in addition to the spiral coil described above. Typically the heat resistance of the heat resistant layers described above (i.e., containing a spiral coil and air, a spiral coil and a material of known resistance, or material of known resistance and no coil) is fixed in the design. In alternate embodiments, resistance materials may include a compressed gas used alone or in addition to a spiral coil. Variable resistance may be achieved by varying the composition and/or the pressure of the gas. Alternatively, a high-boiling liquid (such as Syltherm and Dowtherm) may be filled into the annular gap between the two tubes and sealed in place.

In some embodiments, the heat resistant layer may comprise a layer of material having a known heat resistance. For example, in the embodiment pictured in FIG. 2c, heat resistant layer may comprise a metal having a lower conductivity than aluminum, such as stainless steel. The material may contain open areas or pores to further retard heat transfer. The desired heat resistance would be obtained by setting the number of pores or the volume of the open space. Compressed gas or other material may be included in the pores to calibrate the heat resistance.

FIGS. 4a and 4b are schematic illustrations showing cross-sections of two pedestal assemblies having a calibrated heat resistance between the pedestal and a heat sink. As discussed above, pedestal 402 is supported by pedestal supports 406, which are connected to the chamber bottom 410. The pedestal supports are typically welded to the pedestal supports, though in certain embodiments, they may be attached via other means. Although not depicted in the schematics, pedestal 402 typically includes a heating element to control the pedestal temperature. The heat resistance across the supports is calibrated such that a set amount of the excess heat generated by the external source (not shown) is transferred to the chamber bottom 410. This amount may be based on the amount of heat generated by the lamps and how much heat can be absorbed or dissipated by the heat sink. The heat resistant layer (supports) may comprise a metal, e.g., aluminum, stainless steel, sand, ceramic beads or fiberglass or other known heat resistant material. In certain embodiments, the chamber bottom is equipped with cooling channels—as shown in FIG. 4a at 412. Contact area 414 between each of the pedestal supports and the chamber bottom may be a contact via gravity, a welded connection, a bolted connection, or a contact via other means. As noted above, contact area 414 can also be adjusted, for example, by machining grooves (to reduce contact area), or, by otherwise reducing or increasing the cross-sectional area in order to adjust the contact and conduction resistance. These modifications can increase or decrease the thermal resistance thus providing for adjustment of the amount of heat that is transferred across the elements. In certain embodiments, the contact between the pedestal supports and the pedestal may be similarly adjusted to provide the calibrated heat transfer.

The calibration is based on keeping the pedestal and/or wafer within a desired temperature range. In certain embodiments, it is also based on maintaining a low-boiling coolant below its boiling temperature. As an example, to maintain a pedestal temperature of around 95 C with an input process power (for example from IR+ion-bombardment) of 325 W a total thermal resistance of approximately 3 W/C is needed.

In certain embodiments, the heat resistant layer is able to sustain a high temperature gradient so that the coolant does not boil or over-cool the workpiece. Depending on the desired temperature of the wafer or other object, the temperature gradient across the layer may be around 580° C. (e.g. a 600° C. wafer and 20° C. water). According to various embodiments, the heat resistant layer must be capable of having a temperature gradient of around 600° C., 500° C., 400°, 300° C., 200° or 100° C.

According to various embodiments the resistivity of the heat resistant layer may range from 0.01 to $10°$ C./$W^{-1}$. The resistance of the heat resistant layer dominates so the rate of heat transfer is primarily driven by the heat resistant layer and is relatively insensitive to other modes of heat transfer, such as convective heat transfer from the pedestal, conductive heat transfer from the pedestal to the heat resistant layer, etc. For example, in the case of the tube-in-tube exchanger described above, the rate of heat transfer is relatively insensitive to the conductive heat transfer through the tube walls and the convective heat transfer of the coolant.

Figure 2D:
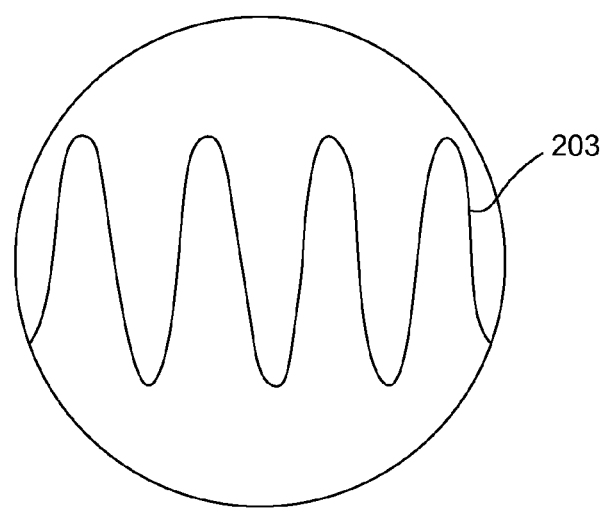
FIG. 2d is a schematic illustration showing a top view of cooling channels in a pedestal according an alternate embodiment of the present invention.
Figure 5:
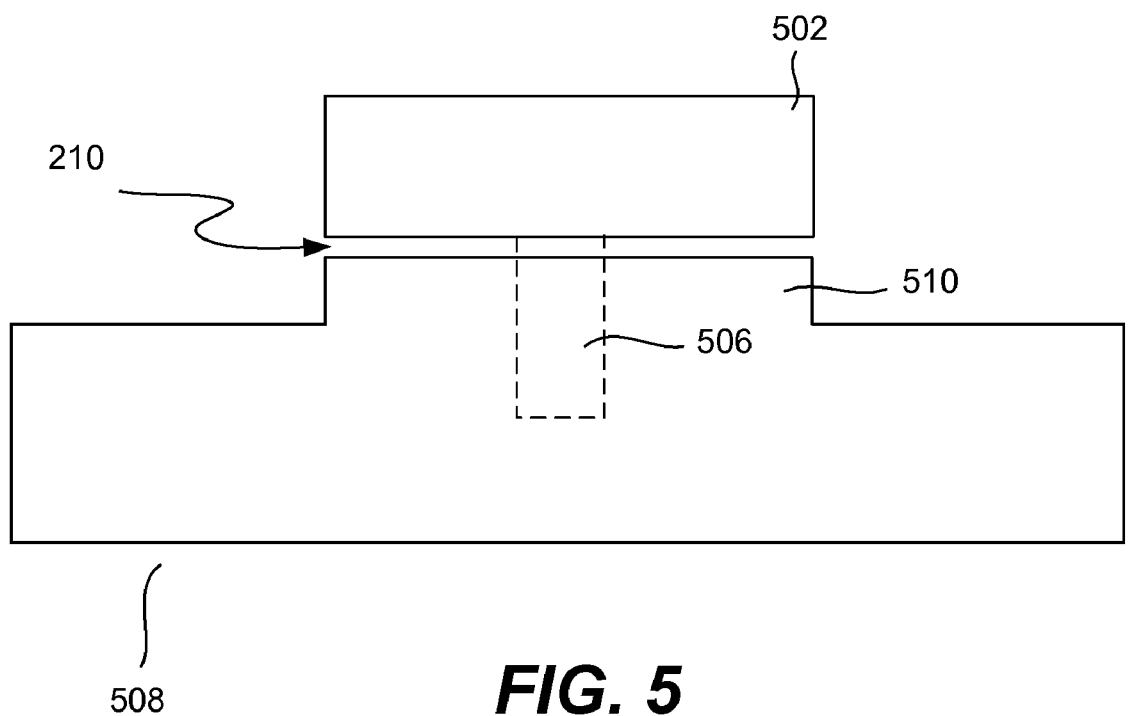
FIG. 5 is a schematic illustration showing a cross-section of a pedestal and proximity heat sink assembly according to one embodiment of the present invention.

In the above-described embodiments, a solid-to-solid heat leak path is used for heat transfer, from the top of the pedestal to cooling channels within the pedestal in FIGS. 2a, 2b and 2d, from the top of the pedestal through a heat resistant layer in FIG. 2c and from the pedestal through pedestal supports to the chamber bottom in FIGS. 4a and 4b. In other embodiments, any solid-to-solid heat leak path having a calibrated heat resistance from the pedestal to a heat sink may be employed. In one such embodiment, the heat transfer assembly includes a heat sink that is capable of being moved in relation to the pedestal. When brought close to or in contact with the pedestal, the desired amount of heat is transferred to the heat sink. When moved away from the pedestal, heat transfer is reduced, in some cases to substantially none. In some embodiments, the heat sink is moved and the pedestal is stationary. In other embodiments, the pedestal is moved and the heat sink is stationary. For example, FIG. 5 shows a pedestal 502 in a chamber 508. A heat sink 510 is used to absorb or dissipate a calibrated amount of excess heat. The pedestal 502 can be moved further from the heat sink via movable shaft 506. The resulting heat conduction gap 510 is thereby varied to vary the calibrated amount of heat dissipated. The heat sink can be made of a thermally conductive material such as aluminum or its alloy. It can be actively cooled or merely conducting to the chamber body. When in the closest position, the heated pedestal can be allowed to make intimate contact to the heat sink or have a proximity gap. An example of gap range is 0.5-1.5 mm. The heat sinks described above with reference to FIG. 5 may be used instead of or in addition to the calibrated heat resistance layers described above with reference to FIGS. 2a-4b.

Figure 6:
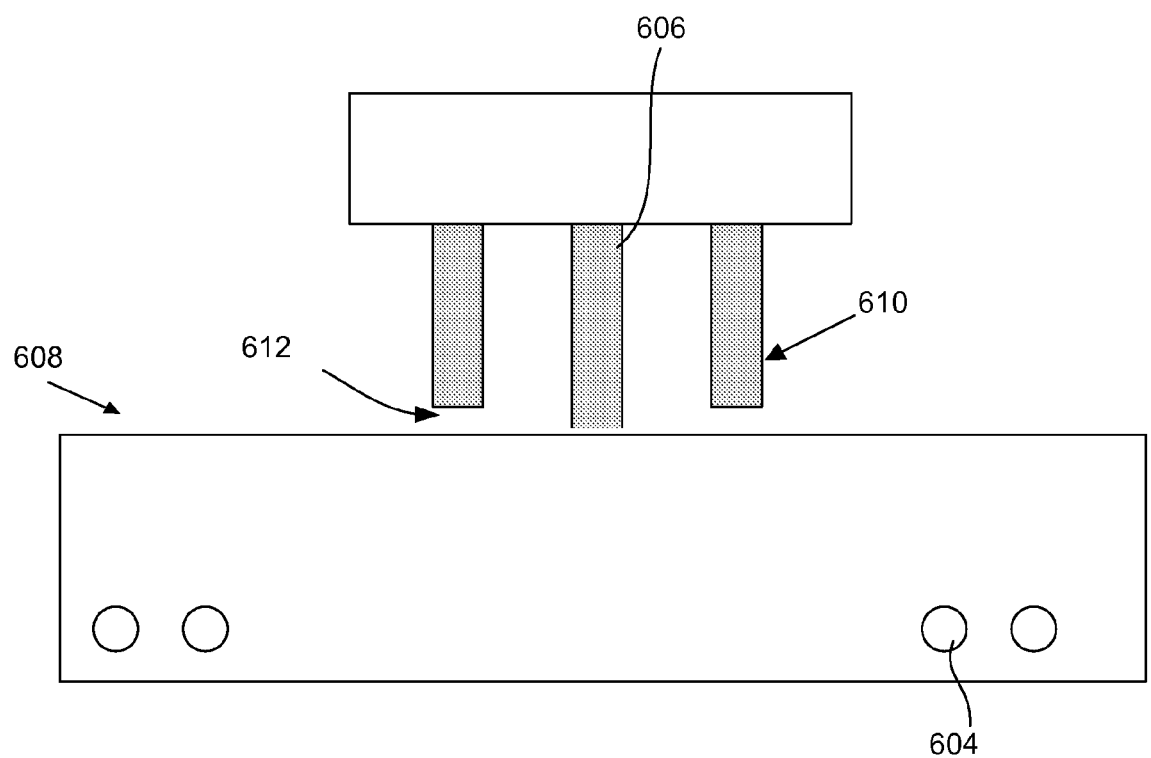
FIG. 6 is a schematic illustration showing a cross-section of a pedestal having heat dissipative protrusions according to one embodiment of the present invention.

In certain embodiments, a pedestal is equipped with one or more heat dissipative protrusions designed to remove a calibrated amount of heat. Each protrusion is separated from the chamber or other heat sink by a proximity gap, which can be can be calibrated to provide the required heat removal. The walls of the chamber are cold surfaces and in some embodiments equipped with coolant channels or otherwise cooled. The protrusions are not connected to the chamber walls, but facilitate dissipation of heat to these cold surfaces. In certain embodiments, these protrusions are used in conjunction with another calibrated heat resistance such as one of those described above in FIGS. 2a-5. The protrusion may be off any appropriate shape or size to provide the desired heat dissipation. In one embodiment, the protrusion is an annular ring around the pedestal. Another embodiment is depicted in FIG. 6, which shows a cross-section of a pedestal equipped an annular ring welded to the underside of the pedestal. Here, a chamber with bottom 608 contains pedestal 602, which is supported by pedestal support or shaft 606. The chamber bottom contains cooling tubes 604. Protrusion 610 extends from the pedestal and is separated from the chamber bottom (or other heat sink) by proximity gap 612, which is calibrated to provide the required heat removal.

The protrusions, such as an annular ring in FIG. 6, have a shape and interfacial area as required to dissipate the excess energy imposed on the workpiece and pedestal by the external source. Other types of protrusions can be envisioned, for example, one where the proximity gap occurs between the pedestal and the protrusion of FIG. 6, while the protrusion is welded at the chamber interface. The protrusions may take the form of fins, bumps, etc. Also, in certain embodiments, the protrusions are connected to the chamber walls. In such an embodiment, the protrusions function similarly to the pedestal supports depicted in FIGS. 4a and 4b: providing a calibrated conductive heat transfer path to a heat sink.

Reflective Pedestal

In certain embodiments, the pedestal surface is modified to have a spectral reflectivity of desired values optimized in such a way as to reflect wavelengths of peak intensity emitted by the external radiant source. In many applications, the external source will emit radiation of a certain range of wavelengths at a high intensity. The high intensity component typically depends on the application; e.g., for UV-induced porogen removal, the high intensity component is at or near the absorption peak of the porogen. For example, a source may have a high intensity component between 250 and 270 nm, with radiation outside this range not emitted or emitted at a lower intensity. The range may be fairly narrow, e.g., around 1-20 nanometers or it may be broader.

Out of a typical 100% incident power from halogen bulb based light source, approximately 30% is reflected back by a silicon wafer, 15% is absorbed by the wafer and 55% is transmitted through it. In case of an anodized pedestal surface, close to 100% of light that was transmitted through the wafer gets absorbed by the pedestal as heat. In the case of a polished aluminum alloy, only 20% is absorbed—making a 5× reduction of the heat load on the pedestal.

According to certain embodiments, the pedestals described herein have a surface that reflects wavelengths that are emitted at high intensity by the external source. Because radiation heating provides a significant amount of heat flux to the pedestal, reflecting at least some of the incident radiation may result in significantly less heat required to be removed. This in turn reduces pedestal temperature control requirements in terms of heater power and response time. The table below shows the difference in heater power required in one example:

|  | Non-reflective pedestal | Reflective Pedestal |
| --- | --- | --- |
| Heat Flux to Pedestal | 4 KW per m$^2$ | 4 KW per m$^2$ |
| Heat Flux Absorbed by Pedestal | 4 KW per m$^2$ | 1 KW per m$^2$ |
| Heat Flux Continously Removed by Heat Sink | 4 KW per m$^2$ | 1 KW per m$^2$ |
| Required Heat Flux Provided by Heater | 8 KW per m$^2$ | 2 KW per m$^2$ |

With the non-reflective pedestal, a large heat sink is necessary to remove the excess heat from the pedestal. When a wafer needs to be heated up to or maintained at an elevated temperature, the heating elements have to overcome that the heat continuously being removed from the pedestal. Eliminating or reducing the amount of heat absorbed by the pedestal means that the heat removed by the heat sink is reduced. The required heater power is also reduced as it does not have to overcome a large heat sink. Heating response time is also reduced.

The reflective surface may be optimized to reflect the wavelengths emitted by the external source at the highest intensity and incident on the pedestal. For incident radiation in the ultraviolet spectrum, mirror polished surfaces may be used. For incident radiation in the infrared and visible spectra, highly polished pedestals may be used. For example, in certain embodiments, commercially available aluminum pedestals are polished to reflect the IR or visible radiation. In certain embodiments, pedestals having a finish in the range of 16 or 32 micro-inches are used for IR sources. Metals that may be polished include aluminum, copper, rhodium and platinum. Effective reflection of visible light and especially UV typically requires smoother surface or optical coatings.

In certain embodiments, only part of the spectral range of the emitted radiation is reflected by the pedestal. For example, a source may emit both UV and IR (as discussed above with reference to mercury vapor lamps). The pedestal is designed to reflect the IR light.

Pedestal surfaces may be polished to give the desired reflectivity, or an optical coating may be applied to the pedestal. Suitable coatings are inert to and able to withstand the processing environment. Pedestals having reflective surfaces may be used apart from or in addition to other heat transfer embodiments described above. The table below provides examples of appropriate materials for various wavelengths:

| Wavelength | Low index (<1.6) | High index (>1.6) |
|---|---|---|
| UV (250-400 nm) | $MgF_2$, $SiO_2$, $Al_2O_3$, $CeF_3$ | $Al_2O_3$, $HfO_2$, $Y_2O_3$, $Sc_2F_3$ |
| Visible/near IR (400-1100 nm) | $MgF_2$, $SiO_2$ | $Zr_2O_2$, $HfO_2$, $Y_2O_3$, $Ta_2O_5$, $Nb_2O_5$, $TiO_2$ |
| Short wavelength - midwavelength IR (1100-5000) | $SiO_2$, $SiO$, $CeF_3$ | $Ta_2O_5$, $HfO_2$, $TiO_2$, $Ge$ |
| Long wavelength IR (5000-12000) | $CeF_3$, $YF_3$, $ThF_4$, $ZnS$ | $ZnS$, $ZnS$, $Ge$ |

Operating Ranges

As indicated above, in certain embodiments the operating range of a heat transfer assembly of the present invention is the temperature range in which the workpiece or pedestal can be modulated solely by adjusting the heating element power. For example, a heat transfer assembly in a pedestal may have an operating range of 300° C.-400° C. The heat transfer assembly is able to maintain the pedestal at any temperature in this range without boiling the coolant (in cases in which a coolant is used), overcooling or going above the set-point temperature. In another embodiment, a heat transfer assembly may have an operating range of 50-300° C.

In embodiments which use calibrated heat resistances, the operating range for a particular range of heat flux is primarily determined by the heater capacity and the resistance of the heat resistant layer. For heat transfer assemblies in which the heating capacity and the resistance are fixed, the operating range for a particular range of heat flux is also fixed. Variable operating capacity may be achieved with variable heat layer resistance as discussed above. Heating capacities of 4 kW have been found to allow operating ranges of about 100° C. (pedestal temperature) with fixed resistance systems. Operating range may be increased by increasing the heater capacity.

According to various embodiments, multiple heat transfer assemblies having different operating ranges may be used. For example, a pedestal may contain two tube-in-tube heat exchangers, each having a different pitch and resistance and operating range (e.g. a 200° C.-300° C. range and a 300°-400° C. range). Water would be selectively run through the appropriate tube during operation.

Although the foregoing invention has been described in some detail for purposes of clarity of understanding, it will be apparent that certain changes and modifications may be practiced within the scope of the appended claims. It should be noted that there are many alternative ways of implementing the present invention. Accordingly, the present embodiments are to be considered as illustrative and not restrictive, and the invention is not to be limited to the details given herein, but may be modified within the scope and equivalents of the appended claims.

What is claimed is:

1. An assembly for maintaining a workpiece exposed to an external heat source at a uniform temperature comprising a heat transfer assembly, said heat transfer assembly comprising:
   a chamber housing;
   a pedestal located in the chamber for supporting the workpiece;
   a source of radiation located above the workpiece for exposing the workpiece to radiation,
   a heat sink for absorbing or dissipating a calibrated quantity of heat from the source of radiation;
   a heat resistant path located between the wafer and the heat sink, said heat resistant path having a heat resistance calibrated such that the workpiece temperature is maintained, and
   one or more protrusions from the pedestal, wherein said protrusions comprise at least part of the calibrated heat resistant path.

2. The assembly of claim 1 wherein one or more protrusions are connected to the heat sink.

3. The assembly of claim 1 further comprising one or more pedestal supports, wherein said pedestal supports comprise at least part of the calibrated heat resistant path.

4. The assembly of claim 1 wherein the heat sink includes at least part of one more chamber walls.

5. The assembly of claim 1 wherein the heat sink comprises cooling channels.

6. The assembly of claim 1 wherein the pedestal is configured to move between a first position and a second position, said second position closer to the heat sink than said first position.

7. An apparatus for exposing a workpiece to radiation comprising:
   a) a source of radiation located above said workpiece, said source configured to emit radiation at a peak intensity of a defined spectral range; and
   b) a pedestal for supporting said workpiece; wherein the top surface of the pedestal is configured to reflect at least 30% of the of the radiation emitted in the defined spectral range.

8. The apparatus of claim 7 wherein the source of radiation emits infra-red radiation.

9. The apparatus of claim 7 wherein the source of radiation emits ultraviolet radiation.

10. The apparatus of claim 7 wherein the top surface of the pedestal is a machined metal.

11. The apparatus of claim 7 wherein the top surface of the pedestal has a mirror polish.

12. The apparatus of claim 7 further comprising a cooling element for removing heat generated by the source of radiation, said cooling element using a coolant having a boiling temperature of less than 200° C. as a heat-transfer fluid.

13. The apparatus of claim 7 further comprising a heat resistant layer located between the cooling element and the workpiece; said layer having a calibrated heat resistance such that coolant in the cooling element does not boil and the workpiece temperature is maintained.

14. An assembly for maintaining a workpiece exposed to an external heat source at a uniform temperature comprising a heat transfer assembly, said heat transfer assembly comprising:
   a) a source of radiation located above the workpiece for exposing the workpiece to radiation,
   b) a heat sink for absorbing or dissipating a calibrated quantity of heat from the source of radiation; and
   c) a pedestal for supporting the workpiece, said pedestal comprising one or more protrusions for transferring the calibrated quantity of heat to the heat sink.

15. An apparatus for exposing a workpiece to radiation comprising:
   a) a source of radiation located above said workpiece, said source configured to emit radiation at a peak intensity of a defined spectral range;
   b) a pedestal for supporting said workpiece; wherein the top surface of the pedestal is configured to reflect the radiation of all or part of the defined spectral range; and
   c) a cooling element for removing heat generated by the source of radiation, said cooling element using a coolant having a boiling temperature of less than 200° C. as a heat-transfer fluid.

* * * * *